United States Patent [19]

Denvir

[11] Patent Number: 5,242,103
[45] Date of Patent: Sep. 7, 1993

[54] PIVOTAL WIRE BONDING STAGE AND METHOD OF USE

[75] Inventor: Melissa Denvir, Mesa, Ariz.

[73] Assignee: Motorola, Inc., Schaumburg, Ill.

[21] Appl. No.: 986,417

[22] Filed: Dec. 7, 1992

[51] Int. Cl.⁵ .......................................... H01L 21/60
[52] U.S. Cl. .................. 228/179.1; 228/4.5; 228/49.1
[58] Field of Search ................. 228/105, 179, 4.5, 6.2, 228/47, 49.1; 296/903

[56] References Cited

U.S. PATENT DOCUMENTS 4,597,522  7/1986  Kobayashi .......................... 228/179
5,060,841  10/1991 Oshima et al. ...................... 228/4.5

Primary Examiner—Samuel M. Heinrich
Attorney, Agent, or Firm—Gary F. Witting

[57] ABSTRACT

A method and apparatus are provided for making a continuous wire bond (139) around an angle of a workpiece (101). A pivotal stage (110) having clamp assemblies (104, 107) are mounted onto a base (102). A workpiece (110) is placed and secured in clamp assemblies (104, 107). A first wire bond site on a first surface is selected and formed. Workpiece (110) is pivotally rotated to a second surface position at an angle to the first surface where a second wire bond site is selected and formed, thereby making a continuous wire bond from the first selected site to the second selected site.

16 Claims, 3 Drawing Sheets

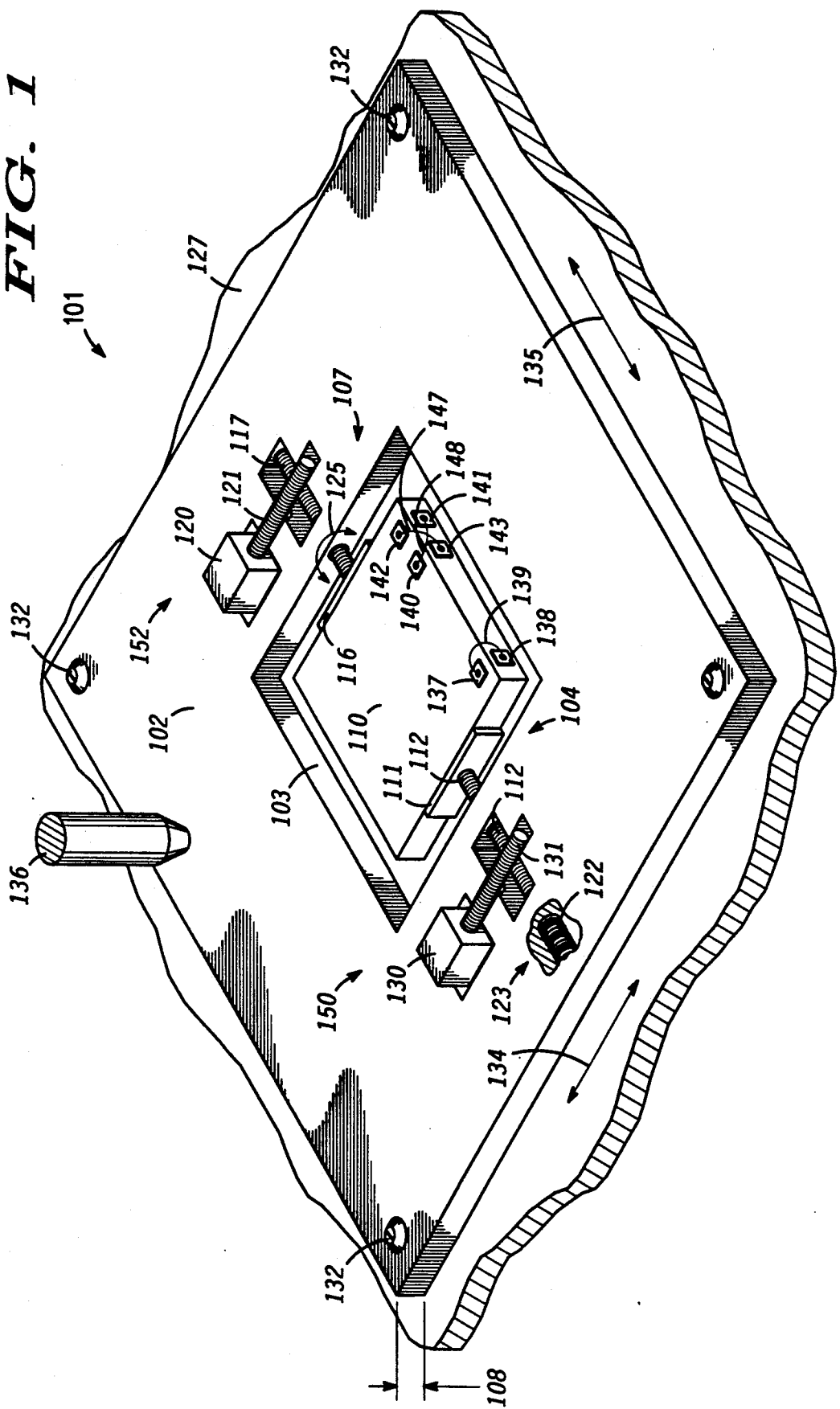

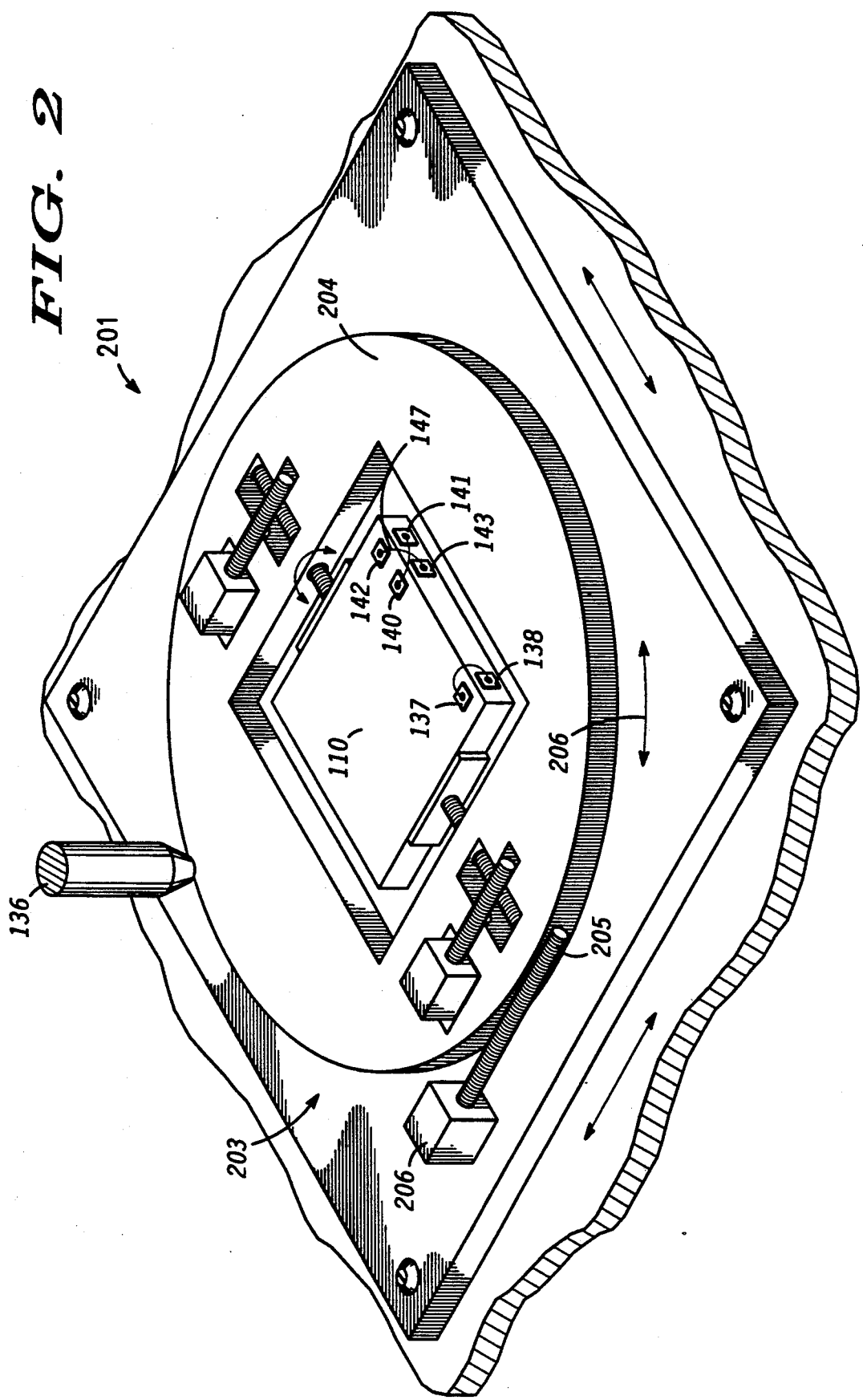

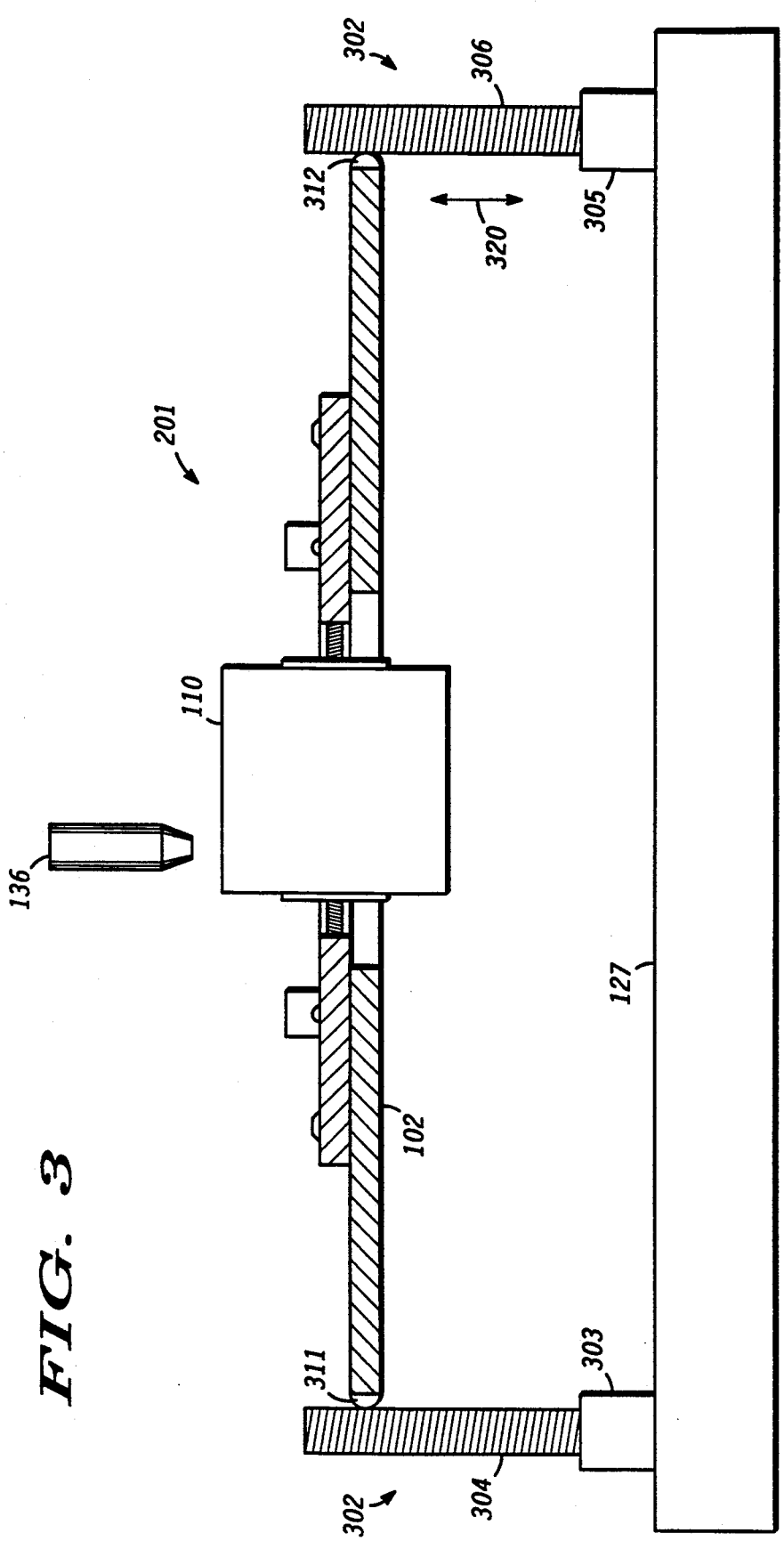

PIVOTAL WIRE BONDING STAGE AND METHOD OF USE

BACKGROUND OF THE INVENTION

This invention relates, in general, to wire bonding and, more particularly, to wire bonding of nonparallel surfaces.

At the present time, conventional wire bonding is commonly done on integrated circuits between bonding pads of an integrated circuit and bonding tips of a leadframe. Typically, the bonding pads of the integrated circuit and the bonding tips of the leadframe are arranged such that a plane is capable of being drawn between the bonding pads and the bonding tips. However, in a worst case situation, either the bonding pads of the integrated circuit are lower than the bonding tips of the leadframe or the bonding tips of the leadframe are lower than the bonding pads of the integrated circuit, thus making the wire bond stepped between two different parallel planes.

However, as electronic interconnection becomes more complex, wire bonding between two sites that are not on parallel surfaces becomes necessary to achieve integration of the non-parallel surfaces. While the conventional process for wire bonding provides a method to wire bond sites that are of differing depths in parallel planes, the conventional bonding process does not provide a method for wire bonding to sites that are not in parallel planes.

It can be readily seen that conventional methods for wire bonding nonparallel surfaces have severe limitations. Also, it is evident that the conventional wire bonding processes are not capable of wire bonding nonparallel plane structures. Therefore, an apparatus and a method for bonding non-parallel plane structures would be highly desirable.

SUMMARY OF THE INVENTION

Briefly stated, a method is provided for making a continuous wire bond around an angle on a workpiece. A wire bond system having a pivotally movable clamping means or an apparatus mounted to a base is provided. A work piece having a first surface and a second surface joined by an angle is mounted to the pivotally movable clamping means. A first position on the first surface of the work piece is selected and a first wire bond is formed on the first selected position. The work piece is pivotally moved to expose the second surface and a second position on the second surface is selected. A second wire bond is formed on the second surface of the work piece at the second position selected, thereby making a continuous connection between the first wire bond and the second wire bond.

Also, a pivotal stage apparatus is described that allows wire bonding of nonparallel surfaces.

BRIEF DESCRIPTION OF THE DRAWINGS

FIG. 1 is a simplified perspective illustration of a pivotal stage;

FIG. 2 is a simplified perspective view of a rotational pivotal stage; and

FIG. 3 is a simplified cross-sectional view of a rotational pivotal stage that is capable of being elevated.

DETAILED DESCRIPTION OF THE DRAWINGS

FIG. 1 is a simplified perspective view of a pivotal stage 101 that includes a base 102 with an opening 103, a first clamp assembly 104, a second clamp assembly 107, a means or an apparatus 150 for generating pivotal movement, a means or an apparatus for opening and closing first and second clamp assemblies 104 and 107, and an X-Y stage 127.

Typically, base 102 is manufactured of any machineable materials such as metals, metal alloys, aluminum, plastics, or the like. Base 102 is machined such that opening 103 is large enough to pivotally rotate a workpiece 110 within opening 103. Further, it should be understood that depth 108 of opening 103 is determined by several factors such as size of workpiece 110, an amount of pivotal rotation required for wire bonding, and mounting of base 102 to a wire bonder (not shown).

Generally, workpiece 110 is any object that requires wire bonding on more than one plane at an angle. However, wire bonding of three dimensional semiconductor devices and composite devices would be particularly useful for devices, such as optical devices, optical devices in combination with semiconductor devices, vertical cavity surface emitting lasers in combination with a waveguide.

First clamp assembly 104 includes a clamp member 111 and a shaft 112 and second clamp assembly 107 includes a clamp member 116 and a shaft 117. Clamp members 111 and 116 are made of any suitable material such as metals, metal alloys, plastics, coated materials, or the like. Further, it is important to realize that specific shapes of clamp members 111 and 116 are application specific. That is, in order to achieve maximum adherence or holding power by clamp members 111 and 116 of workpiece 110, surfaces of clamp members 111 and 116 that engage workpiece 110 are configured specifically to hold workpiece 110. Also, it should be evident that texturing of the engaging surfaces of clamp members 111 and 116 is capable of being achieved in order to maximize the adherence between workpiece 110 and the engaging surfaces of clamping members 111 and 116.

Shafts 112 and 117 are made of any suitable materials that are machineable such as metals, metal alloys, plastics, or the like. Shafts 112 and 117 are attached to clamp members 111 and 116, respectively. Shafts 112 and 117 pass through opposite supportive openings in opposite walls of opening 103, thereby providing structural support to shafts 112 and 117 and clamp members 111 and 116, respectively. Further, these openings in the walls of opening 103 function as bearing surfaces; therefore, these openings typically are constructed to allow shafts 112 and 117 to move easily through the openings. Typically, movement of shafts 112 and 117 is aided by using any or all of several techniques such as a thrust bearing, coating the bearing surfaces with a lubricant, or the like.

In order to grasp and to hold workpiece 110 by clamp assemblies 104 and 107, a compressive force or a spring force is generated closing clamp members 111 and 116 upon workpiece 110. The compressive force is capable of being generated by several different methods such as a spring loaded mechanism, a motor driven mechanism, a combination of a spring loaded mechanism and a motor driven mechanism, or the like. By way of example, shaft 117 is driven in and out to a desired position by a motor 120 connected to a lead screw 121 that is further threadedly engaged with shaft 117. Typically, motor 120 is an electric motor such a stepping motor, a servo motor, an open loop motor, or the like. Electrical connections (not shown) controlling motor 120 are made by any suitable method. As motor 120 provides circular motion to lead screw 121, this circular motion is mechanically transferred to shaft 117 which drives shaft 117 and clamp member 116 either in an inward or outward direction from the wall of opening 103. Shaft 112 resists the outwardly driving force of shaft 117 by a spring means 122 illustrated by partially cutaway view 123. Typically, spring means 122 is contained in an enclosed well drilled in a side of a wall, thus containing spring means 122 in an enclosed well. By selecting an appropriate spring means 122 to balance the driving motion of shaft 117 by motor 120, workpiece 110 is held securely and in an approximately middle region of opening 103.

Pivotal movement of workpiece 110 about shafts 112 and 117 is generated by pivotal movement means such as, a direct drive mechanism, a combination of mechanical linkages, a motor driven mechanism, or a combination of any of the above mentioned means. By way of example, a motor 130 provides a circular motion or rotates to a lead screw 131 that is mechanically coupled to motor 130. Typically, motor 130 is an electric motor such a stepping motor, a servo motor, an open loop motor, or the like. Electrical connections (not shown) that control motor 130 are made by any suitable method. Lead screw 131 is subsequently mechanically coupled to shaft 112 so as to transfer the circular motion from lead screw 131 into a pivotal rotational motion that is subsequently transferred to workpiece 110. As rotational motion is transferred to workpiece 110, clamp member 116 moves about shaft 117. Alternatively, shaft 112 includes a threaded sleeve (not shown) that is formed about shaft 112. The threaded sleeve is coupled to clamp member 111 with an elastic or resilient force, such as a spring, spring loaded pins, or the like. The threaded sleeve is threadedly engaged to lead screw 131 so as to generate rotational motion, illustrated by arrow 125, that is subsequently transferred to workpiece 110 by clamp member 111. Additionally, by using motor 130, workpiece 110 is capable of being pivotally moved in either direction, as illustrated by arrow 125. Further, the pivotal motion is capable of being stopped and held in a desired location so as to provide a stable platform for wire bonding of workpiece 110.

Typically, pivotal stage 101 is mounted to a wire bonder. The wire bonder generally provides several features such as machine vision that recognizes desired sites needing to be wire bonded and automated functions that allow the desired recognized sites to be wire bonded automatically. Generally, X-Y stages are made such two plates, an X plate and Y plate, function together but move independently of each other. That is, the X plate moves in an X direction illustrated by arrow labeled 134, and the Y plate moves in the Y direction illustrated by arrow labeled 135. Moreover, the wire bonder either provides or is associated with a computer system (not shown) capable os sensing and directing movement of at least motors 120 and 130, and X-Y stage 127 movements.

Mounting of pivotal stage 101 to X-Y stage 127 is accomplished by any one of several different methods. First, pivotal stage 101 is capable of being simply disposed onto X-Y stage 127 of the wire bonder. Generally, this is accomplished by having X-Y stage 127 of the wire bonder routed out such that when pivotal stage 101 is placed into the routed out portion of X-Y stage 127 of the wire bonder a firm and snug fit is achieved, thus locating pivotal stage 101 into X-Y stage 127. Screws 132 are optionally added which further secures pivotal stage 101 to X-Y stage 127. Second, pivotal stage 101 can be directly incorporated into X-Y stage 127 a wire bonder, thus removing the need for having base 102. It should be understood that in either of the mounting systems previously discussed that opening 103 has to have a sufficient depth either by increasing depth 108 of base 102 or by continuation of opening 103 into X-Y stage 127, thereby allowing pivotal rotation of workpiece 110. In a preferred embodiment of the present invention, continuation of opening 103 into X-Y stage 127 is used. By either disposing pivotal stage 101 onto X-Y stage 127 or incorporation of pivotal stage 101 into X-Y stage 127, allows workpiece 110 to move pivotally around shafts 112 and 117, as well as to move in both an X direction and a Y direction, which are represented by arrows 134 and 135, respectively.

Use of pivotal stage 101 provides a capability of wire bonding selected sites on nonparallel planes. By way of example, workpiece 110 is mounted and held securely between clamp members 111 and 116. Typically, workpiece 110 defines several planes with bonding pads 137, 140, and 142 defining a first plane and bonding pads 138, 141, and 143 defining a second plane. A first and a second desired wire bond site is recognized and selected such as bonding pads 137 and 138, respectively. Bonding pad 137 is positioned and held such that a parallel plane is made relative to base 102. Bonding head 136 is then placed on bonding pad 137 and a wire bond is made. Bonding head 136 subsequently moves upward allowing bonding wire (not shown) to be released from bonding head 136. In coordination with the upward motion of bonding head 136, workpiece 110 is pivotally rotated until bonding pad 138 is positioned and in a parallel plane to base 102. Workpiece 110 is secured and bonding head 136 subsequently lowers and wire bonds bonding pad 138, thereby creating a continuous wire bond 139 around an angle between bonding pad 137 on the first plane and bonding pad 138 on a second plane. It should be understood that by changing geometric configuration of workpiece 110 it is sometimes necessary to move X-Y stage 127 simultaneously with the pivotal rotation of workpiece 110. Further, a crossing of wire bonds 147 and 148 is capable of being achieved such as wire bonding pad 140 to bonding pad 141 and wire bonding pad 142 to bonding pad 143. This crossing of wire bonds 147 and 148 is achieved by careful integration of movement of bonding head 136, a pivotal rotational movement of workpiece 110, and movement of X-Y stage 127.

FIG. 2 is a simplified perspective view of a rotational pivotal stage 201. The embodiment of the present invention, as shown in FIG. 1, is substantially similar to the embodiment of the present invention in FIG. 2 except for rotational apparatus 203. Rotational apparatus 203 includes a rotational plate 204, a worm gear assembly 205, and a motor 206. Typically, motor 206 is an electric motor such a stepping motor, a servo motor, an open loop motor, or the like. Electrical connections (not shown) that control motor 206 are made by any suitable method. Rotational movement of rotation plate 204 typically is achieved by motor 206 providing a circular motion that is mechanically transferred into worm gear 205. Worm gear 205 then mechanically transfers the circular motion into rotational plate 204, thereby causing rotational plate 204 to move in either rotational direction as illustrated by arrow 206. Use of rotational plate 204 in the present invention allows for a more precise adjustment of workpiece 110. For example, if workpiece 110 is not perfectly shaped, rotational movement of rotation plate 204 is moved which in turn rotationally moves workpiece 110, thus allowing a precise alignment of bonding pads 137, 138, 140, 141, 142, and 143 so as to facilitate the wire bonding procedure or process. Further, movement of rotational plate 204 also provides another degree of freedom for the wire bonding process. For example, movement of rotational plate 204 in coordination with the pivotal movement and the X-Y movement allows for wire bond 147 to be formed with a more acute angle.

FIG. 3 is a simplified cross-sectional view of another embodiment of the present invention. The embodiment as shown in FIG. 3 is similar to the embodiments as shown in FIGS. 1 and 2 except for elevation apparatus 302. Elevation apparatus 302 is capable of being manufactured by several methods, such as a cantilever method, multiple support methods, or the like. For example, use of a cantilever method requires a single motor 303 that drives base 102 by a worm gear 304 to a desired position while base 102 is supported by a cantilever arm (not shown). However, in a preferred embodiment of the present invention, elevation apparatus 302 includes at least two separate motors and worm gear assemblies, i.e., motors 303, 305 and worm gears 304, 306, respectively. Additionally, at least two portions 311 and 312 of base 102 are modified so as to individually engage worm gears 304 and 306 on either side of base 102. Generally, motors 303 and 305 are electric motors, such as stepping motors, servo motors, open loop motors, or the like. Electrical connections (not shown) that control motors 303 and 305 are made by any suitable method. Typically, these portions 311 and 312 are modified directly opposite each other so as to balance the movement of base 102 via movement of worm gear 304 and 306, thus causing rotational pivotal stage 201 to move in a Z axis, or an upward or downward movement, indicated by arrow 320 to a predetermined height. Use of elevational capabilities of the present invention provides several advantages. First, workpiece 110 is capable of being larger in size without further adaptation of X-Y stage 127 of the wire bonder. Second, workpiece 110 is capable of being moved away from bonding head 136 so that workpiece 110 does not damage bonding head 136 during any type of movement. Also, use of elevational properties of this embodiment of the present invention further allows for a more precise wire bond by adding an addition degree of movement.

By now it should be appreciated that a novel method using a pivotal rotational mechanism has been described for making wire bonds on a workpiece. The method and apparatus allow for wire bonding around an angle of the workpiece, thus allowing three-dimensional wire bonding. Additionally, this method allows for an inexpensive process for three-dimension integration of several different devices.

What I claim is:

1. A method for making a continuous wire bond around an angle on a workpiece comprising the steps of:
   providing a wire bond system having a pivotally movable clamping means mounted to a base;
   mounting a workpiece having a first surface and a second surface joined by an angle into the pivotally moveable clamping means that allows the workpiece to pivot on a single axis and further allows the workpiece to be held at any position on the axis;
   moving the workpiece by pivoting the workpiece to a first orientation in which the first surface of the workpiece is accessible for wire bonding;
   selecting a first position on a first surface of the workpiece;
   forming a first wire bond on the workpiece at the first position selected;
   moving the workpiece by pivoting the workpiece to a second orientation in which the second surface of the workpiece is accessible for wire bonding;
   selecting a second position on the second surface of the workpiece; and
   forming a second wire bond on the second surface of the workpiece at the second position selected, thereby making a continuous connection between the first wire bond and the second wire bond.

2. A method for making a continuous wire bond around an angle on a workpiece as claimed in claim 1 wherein the selecting of the first position is achieved by machine vision.

3. A method for making a continuous wire bond around an angle on a workpiece as claimed in claim 1 wherein the moving in a pivotal motion is achieved by a lead screw assembly.

4. A method for making a continuous wire bond around an angle on a workpiece as claimed in claim 3 further comprising an additional movement of the workpiece by an X-Y stage.

5. A rotational and pivotal stage for a wire bonding system comprising:
   a base having a first plate and a second plate, the first plate providing motion in an X direction and the second plate providing motion in a Y direction;
   a third plate with an opening large enough for a workpiece and substantially centered in the third plate, wherein the third plate defines a plane substantially parallel to the base;
   a forth plate with an opening large enough for the workpiece and substantially centered in the forth plate, wherein the forth plate defines a plane substantially parallel to both the base and the third plate, and wherein the forth plate is rotatably disposed onto the third plate;
   Z movement means attached to the base and to the third plate for providing movement to the third plate, thus providing the capability of the third and the forth plate of being raised and lowered to a desired position;
   rotational movement means disposed onto the third plate for providing movement to the fourth plate, whereby the forth plate is rotatable to a desired position; and
   pivotal clamping means for providing pivotal movement in an axis of the pivotal clamping means and holding the workpiece in the openings of the third and forth plates simultaneously, wherein the pivotal clamping means is disposed onto the forth plate.

6. A rotational and pivotal stage for a wire bonding system as claimed in claim 5 wherein the Z movement means comprises a lead screw assembly to drive the third and the fourth plate to a predetermined position.

7. A rotational and pivotal stage for a wire bonding system as claimed in claim 5 wherein the rotational movement means comprise a worm gear drive assembly to rotatably move the forth plate to a predetermined position.

8. A rotational and pivotal stage for a wire bonding system as claimed in claim 5 wherein the pivotal clamping means further comprises a first and a second clamp.

9. A rotational and pivotal stage for a wire bonding system as claimed in claim 8 wherein the pivotal clamping means further comprises a lead screw driving means attached to the first clamp and a spring means attached to the second clamp to hold the workpiece by the first and second clamp.

10. A rotational and pivotal stage for a wire bonding system as claimed in claim 8 wherein the pivotal clamping means further comprises a lead screw driving means attached to the first clamp and a lead screw driving means attached to the second clamp to hold the workpiece by the first and second clamp.

11. A rotational and pivotal stage for a wire bonding system as claimed in claim 10 wherein the pivotal clamping means further comprises a lead screw driving means attached to the second clamp to rotate and hold the second clamp to a desired position, thereby rotating and holding the workpiece and the first clamp to the desired position.

12. A rotational and pivotal stage for a wire bonding system comprising:
a wire bonding system having a wire bonding head;
a base having positional X motion and Y motion, wherein the base has an opening large enough for a workpiece;
a pivotal clamping means incorporated into the base for positioning and holding the workpiece substantially in a central region of the opening; and
pivoting means for pivoting the workpiece relative to the wire bonding system.

13. A rotational and pivotal stage for a wire bonding system as claimed in claim 12 further comprising a rotational movement means disposed onto the base.

14. A rotational and pivotal stage for a wire bonding system as claimed in claim 12 wherein the pivotal clamping means further comprises a first and a second clamp.

15. A rotational and pivotal stage for a wire bonding system as claimed in claim 14 wherein the pivotal clamping means further comprises a lead screw driving means attached to the first clamp and a spring means attached to the second clamp to hold the workpiece by the first and second clamp.

16. A rotational and pivotal stage for a wire bonding system as claimed in claim 15 wherein the pivotal clamping means further comprises a lead screw driving means attached to the first clamp and a lead screw driving means attached to the second clamp to hold the workpiece by the first and second clamp.

* * * * *